United States Patent
Herrmann et al.

(10) Patent No.: US 9,664,558 B2
(45) Date of Patent: May 30, 2017

(54) SUB-BAND INFRA-RED IRRADIATION FOR DETECTOR CRYSTALS

(71) Applicant: KONINKLIJKE PHILIPS N.V., Eindhoven (NL)

(72) Inventors: Christoph Herrmann, Aachen (DE); Roger Steadman Booker, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/440,609

(22) PCT Filed: Nov. 8, 2013

(86) PCT No.: PCT/IB2013/059990
§ 371 (c)(1),
(2) Date: May 5, 2015

(87) PCT Pub. No.: WO2014/072939
PCT Pub. Date: May 15, 2014

(65) Prior Publication Data
US 2015/0285676 A1    Oct. 8, 2015

Related U.S. Application Data

(60) Provisional application No. 61/724,317, filed on Nov. 9, 2012.

(51) Int. Cl.
*G01J 1/44* (2006.01)
*G01T 1/24* (2006.01)
(Continued)

(52) U.S. Cl.
CPC ...... *G01J 1/44* (2013.01); *G01T 1/00* (2013.01); *G01T 1/24* (2013.01);
(Continued)

(58) Field of Classification Search
CPC ....... G01J 1/44; G01J 2001/4446; G01T 1/00; G01T 1/24; H01L 31/02966; H01L 31/085; H01L 31/09; H01L 31/1832
See application file for complete search history.

(56) References Cited

U.S. PATENT DOCUMENTS 5,677,539 A    10/1997  Apotovsky et al.
5,821,539 A    10/1998  Matz et al.
(Continued)

FOREIGN PATENT DOCUMENTS

EP    1394567 A2    3/2004
WO    2004095067 A1    11/2004

OTHER PUBLICATIONS

McKendry, J. J. D., et al.; Individually Addressable AlInGaN Micro-LED Arrays with CMOS Control and Subnanosecond Output Pulses; 2009; IEEE Photonics Technology Letters; 21(12)811-813.

*Primary Examiner* — Marcus Taningco

(57) ABSTRACT

The invention relates to radiation detection with a directly converting semiconductor layer for converting an incident radiation into electrical signals. Sub-band infra-red (IR) irradiation considerably reduces polarization in the directly converting semi-conductor material when irradiated, so that counting is possible at higher tube currents without any baseline shift. An IR irradiation device is integrated into the readout circuit to which the crystal is flip-chip bonded in order to enable 4-side-buttable crystals.

10 Claims, 3 Drawing Sheets

(51) Int. Cl.
  *G01T 1/00* (2006.01)
  *H01L 31/0296* (2006.01)
  *H01L 31/08* (2006.01)
  *H01L 31/09* (2006.01)
  *H01L 31/18* (2006.01)

(52) U.S. Cl.
  CPC ...... *H01L 31/02966* (2013.01); *H01L 31/085* (2013.01); *H01L 31/09* (2013.01); *H01L 31/1832* (2013.01); *G01J 2001/4446* (2013.01)

(56) References Cited

U.S. PATENT DOCUMENTS

| | | |
|---|---|---|
| 6,373,064 B1 | 4/2002 | Yao et al. |
| 6,989,539 B2 * | 1/2006 | Wischmann et al. .... 250/370.11 |
| 7,196,334 B2 | 3/2007 | Simon et al. |
| 7,223,981 B1 | 5/2007 | Capote et al. |
| 8,927,937 B2 * | 1/2015 | Schwarzman et al. .. 250/370.01 |
| 2008/0164418 A1 | 7/2008 | Shahar et al. |
| 2010/0086098 A1 * | 4/2010 | Shahar et al. .................... 378/4 |
| 2011/0253886 A1 | 10/2011 | Hackenschmied et al. |
| 2014/0037066 A1 * | 2/2014 | Hackenschmied et al. .... 378/91 |

\* cited by examiner

SUB-BAND INFRA-RED IRRADIATION FOR DETECTOR CRYSTALS

CROSS REFERENCE TO RELATED APPLICATIONS

This application is a national filing of PCT application Serial No. PCT/IB2013/059990, filed Nov. 8, 2013, published as WO 2014/072939 A1 on May 15, 2014, which claims the benefit of U.S. provisional application Ser. No. 61/724,317 filed Nov. 9, 2012, which is incorporated herein by reference.

FIELD OF THE INVENTION

The invention relates to the field of radiation detectors such as—but not limited to—X-ray detectors comprising a directly converting semiconductor layer for converting an incident radiation into electrical signals. More specifically, the invention relates to the field of photon-counting (energy resolving) detectors e.g. for human medical imaging or other purposes.

BACKGROUND OF THE INVENTION

X-ray detectors comprising a directly converting semiconductor layer enable individual X-ray quanta or photons to be detected quantitatively and energy-selectively. In the case of this type of X-ray detectors, an incident X-ray photon generates free charge carriers in the form of electron-hole pairs in the semiconductor layer on account of in part multistage physical interaction processes with a semiconductor material. By way of example, semiconductor materials in the form of CdTe, CdZnTe (CZT), CdTeSe, CdZn-TeSe, CdMnTe, InP, TlBr2 or HGI2 are suitable for detecting X-ray photons since these materials have a high X-ray absorption in the energy range of medical imaging. As an example, CZT is unique compared with silicon and germanium detectors in that it operates at room temperature and is capable of processing more than one million photons per second per square millimeter. The spectroscopic resolution of CZT outperforms that of most other detectors.

In order to detect the absorption events corresponding to an X-ray photon, electrodes are fitted to two sides of the semiconductor layer and a voltage is applied to the electrodes in order to generate an electric field. For the spatially resolved detection of the absorption events, one electrode is embodied in pixelated fashion and is designated as a readout electrode. Another electrode arranged opposite to it is usually embodied in planar fashion and is designated as a counter electrode. In an electric field generated between these electrodes (i.e. anode and cathode), liberated charge carriers are accelerated depending on type of charge and polarity at the electrodes, where they induce electrical signals in the form of currents. The currents are converted, e.g., by means of an evaluation unit, into an evaluation signal, the magnitude of which is proportional to the area integral of the current curve and thus proportional to that quantity of charge which is liberated by an incident X-ray photon. The evaluation signal thus generated is subsequently conducted to a pulse discriminator, which, in a threshold-value-based manner, detects the X-ray.

Photon-counting energy-resolved spectral computed tomography (PCS-CT) detectors are expected to be the next big step in medical CT. Since individual photons are to be counted and characterized coarsely as to their energy at photon count rates of 20 Mcps/mm2 or more, such detectors have to be built with direct converting materials like Cd[Zn]Te instead of scintillators which exhibit scintillation (the property of luminescence when excited by ionizing radiation) and which are much slower than CZT. For future garnet based scintillators this may change, however, for such devices also very fast photodiodes are needed, which have to convert the light into electrical signals. Hence, currently direct conversion materials like Cd[Zn]Te remain a favourable option to for PCS-CT.

However, CZT material is prone to polarization, i.e. formation of a space-charge within a pixel volume when irradiated with X-rays, which space-charge weakens the applied electrical field so that electron-hole pairs, which are generated in an interaction of an X-ray photon with the CZT material, no longer drift fast enough towards the anode and cathode. As a consequence, insufficient or even no charge is collected, and the measurement result is simply wrong. This is illustrated in FIG. 4a which shows measured counts over 12000 short measurement periods of 100 μs on 4 different energy channels Ch1 to Ch4 at four different respective thresholds (30 keV, 33 keV, 36 keV, 51 keV). Shortly before 2000 measurement periods the X-ray irradiation starts (a shutter is opened), and at about 7000 measurement periods the X-ray irradiation stops (the shutter is closed). Due to polarization effects in the detecting material volume after the onset of the X-ray irradiation, the number of counts breaks down for later measurement periods. The upcoming space charge weakens the electric field so that fewer electrons reach the anode, which manifests itself in a reduced number of counts. Depending on the actual threshold value this break down is observed at different points in time.

SUMMARY OF THE INVENTION

It is an object of the present invention to provide more efficient radiation detection with less polarization in the conversion material.

This object is achieved by a radiation detector as claimed in claim 1, a detection method and a manufacturing method.

Accordingly, radiation photons reduce the tendency towards polarization within pixels of the direct conversion material so that counting at higher X-ray fluxes becomes possible. The added IR light causes deep traps to be released so that no space charge comes into being. More specifically, by using sub-band IR light, the radiation to be detected is not simply absorbed by the direct conversion material and can generate electron-hole pairs (e.g. at defect states). If the proposed IR irradiation is done from the side, where there is not metallization, the IR light is not absorbed (strictly speaking: only absorbed by defect states), so that also pixels which are farthest away from the IR light source still receive sufficient sub-band IR light.

According to a first aspect, the plurality of infrared radiation sources are adapted to irradiate the directly converting semiconductor layer with a sub-band infrared radiation having a photon energy smaller than the band gap of the directly converting semiconductor layer. Radiation photons with energies smaller than the band gap further reduce the tendency towards polarization within pixels of the direct conversion material According to a second aspect which can be combined with the first aspect, the plurality of infrared radiation sources may be provided on an infrared source layer which is interposed between the directly converting semiconductor layer and a readout chip of the substrate and which is flip-chip bonded to the directly converting semiconductor layer via the pixel pads. Such a structure with flip-chip bonding allows high packing densities due to the 4-side-buttable structure.

According to a third aspect which can be combined with the first or second aspect, each of the plurality of infrared radiation sources may be arranged at a gap portion of the pixel pads, i.e., where the direct conversion material is not covered by pad metallization. Thereby, at least a part of the IR radiation can enter the directly converting semiconductor layer without any damping by electrode metallization.

According to a fourth aspect which can be combined with any one of the first to third aspects, the infrared source layer may comprise through-connection-portions for electrically connecting the pixel pads to related contact portions on the readout chip. This measure reduces wiring complexity and thus further increases packaging density.

According to a fifth aspect which can be combined with any one of the first to fourth aspects, the plurality of infrared sources may comprise a plurality of groups each consisting of infrared sources with different wavelengths of the sub-band infrared radiation. Thus, efficiency of IR irradiation can be increased by providing a wider radiation spectrum. In a more specific implementation of the fourth aspect, each infrared source of one of the plurality of groups may be arranged at a different corner of a respective pixel pad of the directly converting semiconductor layer. Thereby, spatial distribution of the different wavelengths can be balanced.

According to a sixth aspect which can be combined with any one of the first to fifth aspects, the plurality of infrared sources may be arranged to irradiate the directly converting semiconductor layer from an anode side. This provides the advantage that radiation loss due to electrode metallization can be reduced since the anode electrode is provided with gap portion.

According to a seventh aspect which can be combined with any one of the first to sixth aspects, wherein each of the infrared sources may be allocated to a subset of pixels of the radiation detector. This reduces the number of infrared sources and allows higher packaging densities.

According to an eighth aspect which can be combined with any one of the first to seventh aspects, the directly converting semiconductor layer may be made of a Cd[Zn]Te crystal. This material allows fast photon counting. Here, the notation Cd[Zn]Te is used to represent two materials CdTe and CdZnTe (i.e. CZT).

According to a ninth aspect which can be combined with any one of the first to eighth aspects, the manufacturing process may comprise interposing the infrared source layer with the plurality of infrared radiation sources between the directly converting semiconductor layer and the readout chip.

According to a tenth aspect which can be combined with any one of the first to ninth aspects, the manufacturing process may comprise bonding the directly converting semiconductor layer to the readout chip with the connected or integrated infrared radiation sources.

According to an eleventh aspect which can be combined with any one of the first to tenth aspects, the manufacturing method may further comprise using the infrared source layer as an interposer to test the directly converting semiconductor layer before mounting it to the readout chip. Thereby, the effect of the proposed additional IR radiation can be evaluated during the manufacturing process.

It shall be understood that the substance determining the radiation detector of claim 1, the detection method and the manufacturing method have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
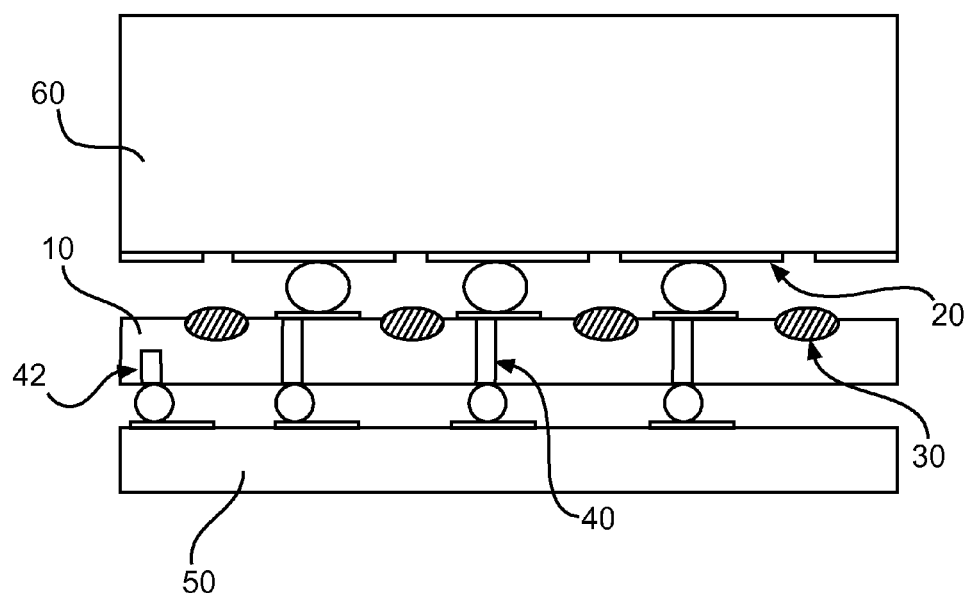
FIG. 1 shows schematically and exemplarily a cross-sectional side view of a radiation detector according to a first embodiment.

FIG. 1 shows schematically and exemplarily a cross-sectional side view of a radiation detector according to a first embodiment with an IR LED layer 10 interposed between a 4-side-buttable CMOS (Complementary Metal Oxide Semiconductor) readout circuit or chip 50, e.g. and application specific integrated circuit (ASIC), and a CZT crystal 60. The CZT crystal 60 is flip-chip bonded via pixel pads 20 to a substrate (i.e. IR LED layer 10 and readout chip 50) which does the readout. More specifically, an IR irradiation device (i.e. the IR LED layer 10) is integrated into the readout chip 50 to which the CZT crystal 60 is flip-chip bonded, so that a 4-side-buttable crystal is achieved, in which electrical input/output circuits are arranged under the device rather than at its edge. This 3-D packaging allows extremely close spacing of radiation detectors.

Irradiation with sub-band IR LED light, where the optical photons have an energy which is smaller than the band gap, reduces the tendency towards polarization within pixels of the CZT crystal 60 so that counting at higher X-ray fluxes becomes possible. However, IR irradiation from the side has the disadvantage that it only allows for 3-side-buttable detector modules. In order to support 4-side-buttable detectors, IR irradiation can be done from the cathode side (i.e. upper side in FIG. 1), where the cathode metallization (not shown) probably may not be an obstacle, since it is thin. Then, however, the IR LED layer 10 is within the X-ray beam. As an alternative option, IR irradiation can be done from the anode side (i.e. lower side in FIG. 1), which is advantageous since on the anode side, there are anyway non-metalized regions. The IR irradiation would further be improved, if these pixel gaps are irradiated.

Hence, as indicated in FIG. 1, the pixels of the readout electronics of the readout chip 50 are bonded via respective solder bumps and through connection portions 40 directly to the pixel pads 20 of the CZT crystal 60. Additionally, a supply contact 42 for the IR LED layer 10 is provided. The substrate with the readout circuit also implements—besides the readout electronics—one or more sub-band IR LED sources 30. Optionally, as described below in connection with the second embodiment, more than one IR LED source 30 per pixel may be implemented, if different IR light wavelengths are to be used, which may help to release even more charges of deep traps of different energies.

Alternatively, it may suffice to implement the IR LED sources 30 only in a sub-set of pixels. Since the IR LED sources 30 may be manufactured from GaAs or AlGaAs material which differs from CMOS, the IR LED sources 30 can be implemented on a different substrate (i.e. the IR LED layer 10), which is then flip-chip bonded to the readout electronics of the readout chip 50 manufactured in CMOS technology, as discussed e.g. in McKendry et al.: "Individually addressable AlInGaN micro-LED arrays with CMOS control and subnanosecond output pulses", IEEE Photonics Techn Let, Vol. 21, No. 12, Jun. 15, 2009. The CMOS substrate of the readout chip 50 implements the contact pad for each pixel and may also implement the power supply for the IR LED layer 10. The IR LED layer 10 through-contacts the pixel pads 20 by the through connection portions 40 so that the IR LED layer 10 can be flip-chip bonded to the CZT crystal 50, where the emitting dots of the IR LED sources 30 on the IR LED layer 10 illuminate pixel gaps or through the thin pad metallization of the pixel pads 20.

Furthermore, during the manufacturing process the LED IR layer 10 can be used as an interposer to also test the CZT crystal 60 before mounting it to the readout electronics, so that after mounting the LED IR layer 10, the CZT crystal 60 can be tested as to its performance for energy-resolved X-ray photon detection together with IR light irradiation. Thus, it is possible to measure how far the considered CZT crystal 60 can actually improve its performance due to the added IR irradiation.

Figure 2:
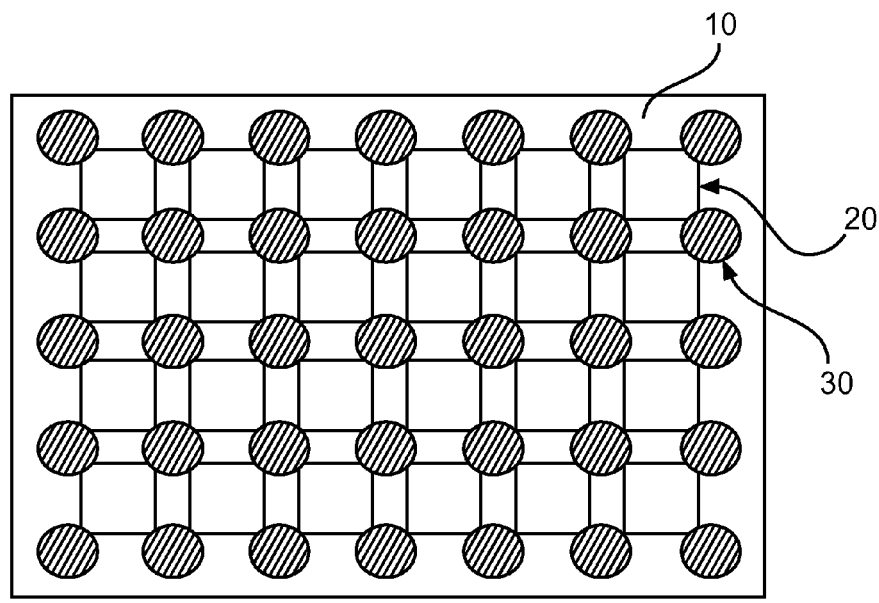
FIG. 2 shows schematically and exemplarily a top view of the radiation detector according to the first embodiment.

FIG. 2 shows schematically and exemplarily a top view (towards the anode side) of the radiation detector according to the first embodiment with a 2D arrangement of the IR LED sources 30 on the IR LED layer 10 for a single IR wavelength. As can be gathered from FIG. 2, the IR LED sources 30 are arranged at the pixel gaps between the pixel pads 20 of the CZT crystal 60 (not shown in FIG. 2).

Figure 3:
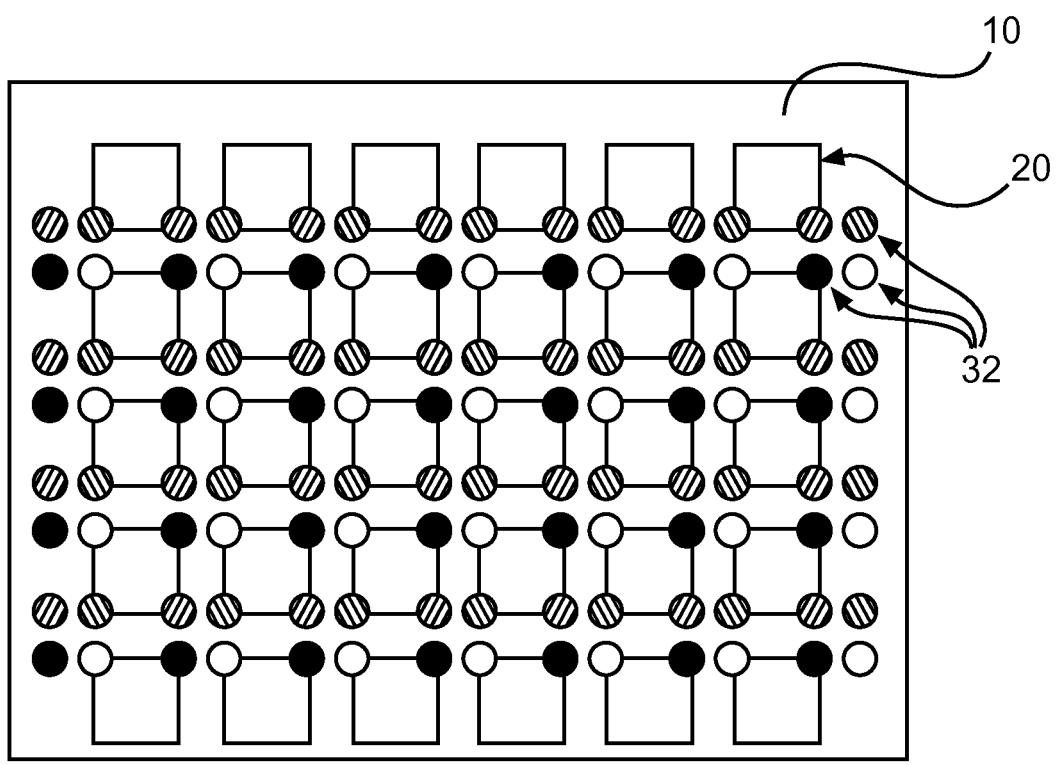
FIG. 3 shows schematically and exemplarily a top view of a radiation detector according to a second embodiment for different IR wavelengths.

FIG. 3 shows schematically and exemplarily a top view (towards the anode side) of a radiation detector according to a second embodiment with a 2D arrangement for IR LED sources 32 providing four different IR wavelengths. In the second embodiment, four IR LED sources 32 of different IR wavelengths are arranged at the edges of neighbouring pixel pads 20 of the CZT crystal 60 (not shown in FIG. 3).

In the above first and second embodiments, the IR LED sources 30, 32 may be integrated into the CMOS readout chip 50. E.g., organic LEDs (OLEDs) may be integrated into a Si CMOS ASIC. With such an integration, further simplifications of the embodiments are possible.

Figure 4A:
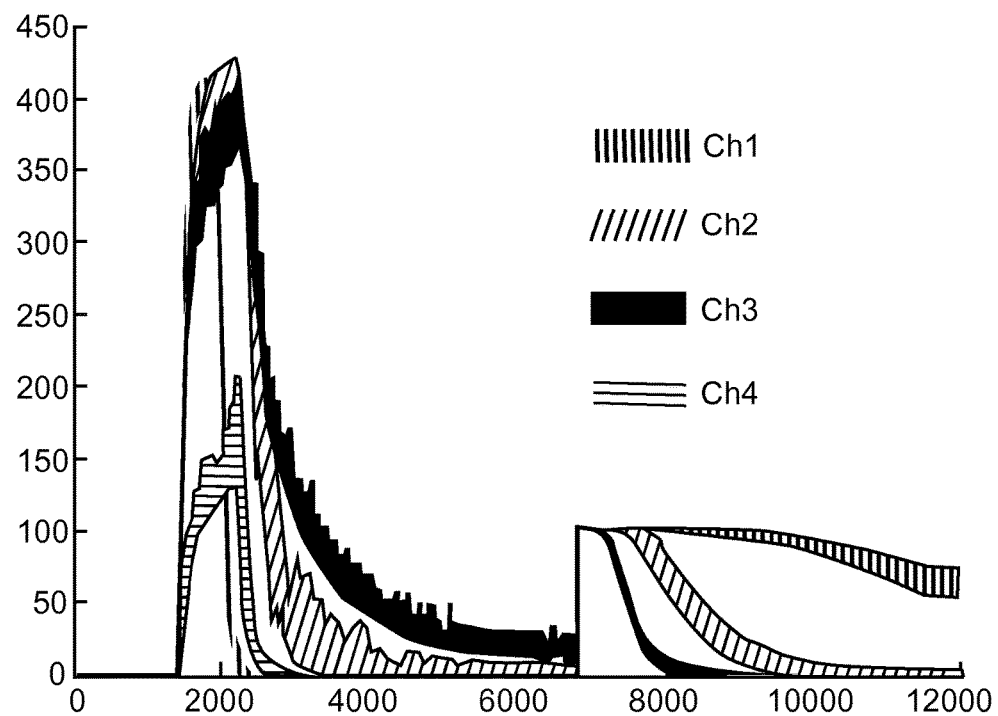
FIGS. 4a and 4b show schematic diagrams of measured counts over short measurement periods without and with IR-LED irradiation, respectively.
Figure 4B:
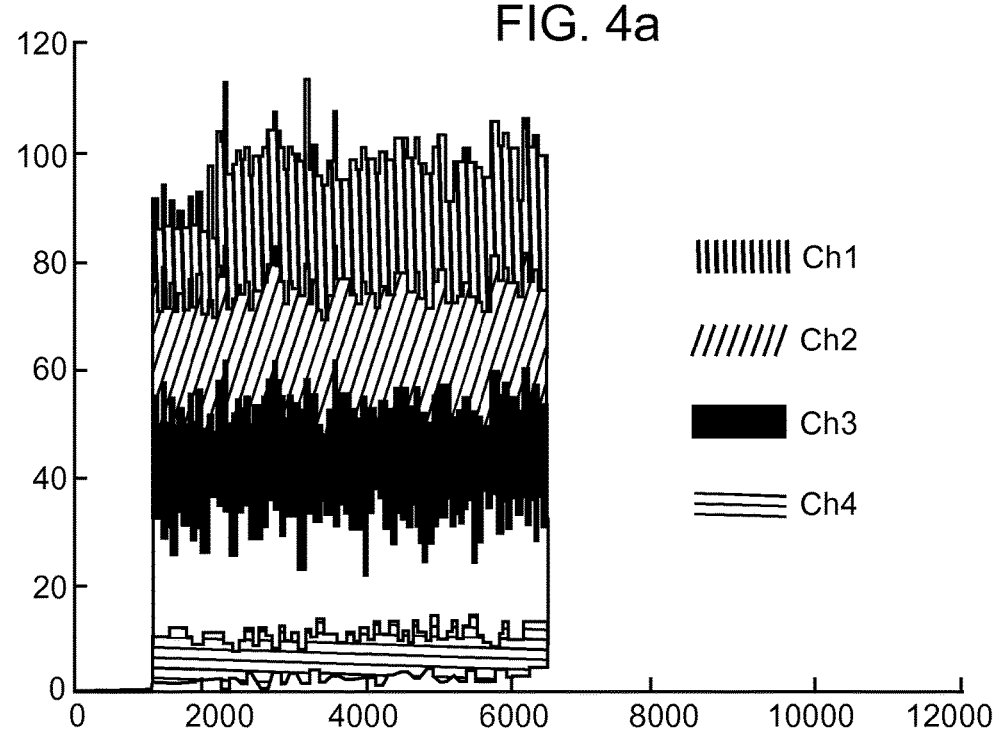

FIG. 4b shows a diagram similar to FIG. 4a and indicating measured photon counts over the number of short measurement periods of 100 μs on 4 different energy channels Ch1 to Ch4 with four different thresholds (30 keV, 33 keV, 36 keV, 51 keV) with added IR-LED irradiation (880 nm). As can be gathered from FIG. 4b, the IR light causes the count rate drop to disappear, which can be explained by the deep traps being released so that no space charge comes into being. With the proposed sub-band IR radiation, the IR light is not simply absorbed by the CZT material and can generate electron-hole pairs (due to defect states). In the experiments underlying the diagram of FIG. 4b, IR irradiation was done from the side. Since the light is not absorbed, also pixels which are farthest away from the light source still receive sufficient sub-band IR light.

In summary, radiation detection with a directly converting semiconductor layer for converting an incident radiation into electrical signals has been described. Sub-band infra-red (IR) irradiation considerably reduces polarization in the directly converting semiconductor material when irradiated, so that counting is possible at higher tube currents without any baseline shift. An IR irradiation device is integrated into the readout circuit to which the crystal is flip-chip bonded in order to enable 4-side-buttable crystals.

Although in the above described embodiments the radiation to be detected is X-ray, in other embodiments also other types of radiation can be used. For instance, the radiation source can be a radiation source generating light within another wavelength range, for instance, in the visible wavelength range. The radiation source can also be a lasing device.

Furthermore, although in the above embodiments, sub-band infra-red light is discussed, also other radiation wavelengths may allow for reducing polarization effects. Hence, the present invention is not intended to be limited to sub-band radiation. The described IR sources may be IR laser diodes instead of the IR LEDs 30, or other radiation sources with other wavelengths. Also, the readout chip 50 is not intended to be restricted to CMOS technology and can be implemented based on any other semiconductor technology. The direct conversion material is not restricted to CZT. Rather, any other suitable semiconductor material in the form of CdTe, CdTeSe, CdZnTeSe, CdMnTe, InP, TIBr2 or HGI2 can be used instead of the CZT crystal 60 for detecting X-ray or other radiation photons Other variations to the disclosed embodiments can be understood and effected by those skilled in the art in practicing the claimed invention, from a study of the drawings, the disclosure, and the appended claims.

The figures are schematically only. For instance, they are not to scale, i.e., for example, the electrodes are thinner than shown in the figures.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:
1. A radiation detector comprising:
a) a directly converting semiconductor layer for converting an incident radiation into electrical signals;
b) a substrate comprising readout electronics for receiving said electrical signals via pixel pads arranged at said directly converting semiconductor layer; and
c) a plurality of radiation sources connected or integrated to said substrate and adapted to irradiate said directly converting semiconductor layer;
wherein
d) said plurality of infrared radiation sources are provided on an infrared source layer which is interposed between said directly converting semiconductor layer and a readout chip of said substrate and which is flip-chip bonded to said directly converting semiconductor layer via said pixel pads, wherein said plurality of infrared radiation sources adapted to irradiate said directly converting semiconductor layer are arranged at corners of the pixel pads of said directly converting semiconductor layer, wherein said infrared source layer com- prises through connection portions for electrically connecting said pixel pads to related contact portions on said readout chip.

2. The radiation detector as defined in claim 1, wherein said plurality of radiation sources are adapted to irradiate said directly converting semiconductor layer with a sub-band infrared radiation having a photon energy smaller than the band gap of said directly converting semiconductor layer.

3. The radiation detector as defined in claim 1, wherein each of said plurality of infrared radiation sources is arranged at a gap portion of said pixel pads.

4. The radiation detector as defined in claim 2, wherein said plurality of infrared sources comprise a plurality of groups each consisting of infrared sources with different wavelengths of said sub-band infrared radiation.

5. The radiation detector as defined in claim 4, wherein each infrared source of one of said plurality of groups is arranged at a different corner of a respective pixel pad of said directly converting semiconductor layer.

6. The radiation detector as defined in claim 1, wherein said plurality of infrared sources are arranged to irradiate said directly converting semiconductor layer from an anode side.

7. The radiation detector as defined in claim 1, wherein each of said infrared sources is allocated to a subset of pixels of said radiation detector.

8. The radiation detector as defined in claim 1, wherein said directly converting semiconductor layer is made of a Cd[Zn]Te crystal.

9. A method of manufacturing a radiation detector, said method comprising:
   a) arranging a plurality of pixel pads on a directly converting semiconductor layer for converting an incident radiation into electrical signals;
   b) connecting a readout chip for receiving said electrical signals to said pixel pads; and
   c) connecting or integrating a plurality of infrared radiation sources to said readout chip;
   wherein
   interposing an infrared source layer with said plurality of infrared radiation sources between said directly converting semiconductor layer and said readout chip, wherein said plurality of infrared radiation sources are arranged at corners of the pixel pads of said directly converting semiconductor layer;
   wherein connecting a readout chip for receiving said electrical signals to said pixel pads includes flip-chip bonding though connection portions within and through the infrared source layer which connect the directly converting semiconductor layer via the pixel pads to the readout chip.

10. The method as defined in claim 9, further comprising using said infrared source layer as an interposer to test said directly converting semiconductor layer before mounting it to said readout chip.

* * * * *